United States Patent [19]
Huffman et al.

[11] Patent Number: 4,574,385
[45] Date of Patent: Mar. 4, 1986

[54] CLOCK DIVIDER CIRCUIT INCORPORATING A J-K FLIP-FLOP AS THE COUNT LOGIC DECODING MEANS IN THE FEEDBACK LOOP

[75] Inventors: Charles E. Huffman, Plano; Jeffrey L. Foust, Dallas, both of Tex.

[73] Assignee: Rockwell International Corporation, El Segundo, Calif.

[21] Appl. No.: 580,973

[22] Filed: Feb. 16, 1984

[51] Int. Cl.$^4$ ............................................. H03K 21/38
[52] U.S. Cl. ........................................ 377/107; 377/48
[58] Field of Search ................. 377/107, 118, 47, 110, 377/2; 307/265; 328/58

[56] References Cited

U.S. PATENT DOCUMENTS

| | | | |
|---|---|---|---|
| 3,393,366 | 7/1968 | Shoop | 377/110 |
| 3,873,815 | 3/1975 | Summers | 377/108 |
| 4,041,280 | 8/1977 | Ohsako et al. | 377/52 |
| 4,053,739 | 10/1977 | Miller et al. | 377/52 |
| 4,223,212 | 9/1980 | Smith et al. | 377/2 |
| 4,254,327 | 3/1981 | Beno et al. | 377/52 |
| 4,330,751 | 5/1982 | Swain | 328/58 |

Primary Examiner—Stanley D. Miller
Assistant Examiner—Karl Ohralik
Attorney, Agent, or Firm—Bruce C. Lutz; V. L. Sewell; H. Fredrick Hamann

[57] ABSTRACT

A circuit approach is illustrated for simplifying a count divider circuit by applying selected outputs of the counter to a J-K flip-flop as input to the J-K terminals whereby a comparatively high speed response is returned for presetting the counter as compared to the prior art approach which either required much more circuitry or intolerable time delays.

3 Claims, 7 Drawing Figures

| Q3 | Q2 | Q1 | Q0 | Q | | | Q3 | Q2 | Q1 | Q0 | Q |
|---|---|---|---|---|---|---|---|---|---|---|---|
| 1 | 0 | 1 | 1 | 1 | a | | 1 | 0 | 1 | 1 | 1 |
| 1 | 1 | 0 | 0 | 1 | b | | 1 | 1 | 0 | 0 | 1 |
| 1 | 1 | 0 | 1 | 1 | c | | 1 | 1 | 0 | 1 | 1 |
| 1 | 1 | 1 | 0 | 1 | d | | 1 | 1 | 1 | 0 | 1 |
| 1 | 1 | 1 | 1 | 1 | e | | 1 | 1 | 1 | 1 | 1 |
| 0 | 0 | 0 | 0 | 1 | f | | 0 | 0 | 0 | 0 | 1 |
| 0 | 0 | 0 | 1 | 0 | g | | 0 | 0 | 0 | 1 | 0 |
| 1 | 0 | 1 | 1 | 1 | h | | 1 | 0 | 1 | 0 | 1 |
|   |   |   |   |   | i | | 1 | 0 | 1 | 1 | 1 |

FIG. 5   FIG. 6

| | J | $\bar{K}$ | $Q_{n+1}$ |
|---|---|---|---|
| a | 1 | 1 | 1 |
| b | 1 | 0 | $\bar{Q}_n$ |
| c | 0 | 1 | $Q_n$ |
| d | 0 | 0 | 0 |

FIG. 7

CLOCK DIVIDER CIRCUIT INCORPORATING A J-K FLIP-FLOP AS THE COUNT LOGIC DECODING MEANS IN THE FEEDBACK LOOP

The present invention is generally related to electronics and more specifically related to counting circuits. Even more specifically, the present invention is related to a counter wherein the count is decoded by the J-K inputs of a J-K flip-flop whereby circuit complexity is reduced and maximum error-free clock operation frequency is increased.

BACKGROUND

In the prior art, emitter coupled logic (ECL) has been used to implement clock divider circuits at high frequencies and, in particular, above 44 megahertz. The disadvantages of this prior art implementation are the very high power dissipation and the low reliability induced in the circuitry due to the high temperature operation. Also, these prior art ECL circuits at times had to incorporate many additional pieces of circuitry to compensate for time delays inherent in the decoding devices necessary to provide a specific dividing function. The increase in number of circuit components has added to the reliability problem.

The present invention accomplishes the divider operation by selecting specific binary count indications to be used in combination with the output of a J-K flip-flop such that the counter comprising a portion of the clock divider is preset (reset to a given count value) to again commence counting.

It is therefore an object of the present invention to reduce the number of parts and/or increase the speed of operation of a divider circuit while increasing circuit reliability.

Other objects and advantages of the present inventive concept will be apparent from a reading of the specification and appended claims in conjunction with the drawings wherein:

FIG. 5 is a truth table used in explaining the modulo 7 operation of FIG. 2;

FIG. 6 is a truth table used in explaining the modulo 8 operation of FIG. 2; and FIG. 7 is a truth table illustrating the operation of a J-K flip-flop.

DETAILED DESCRIPTION

Figure 1:
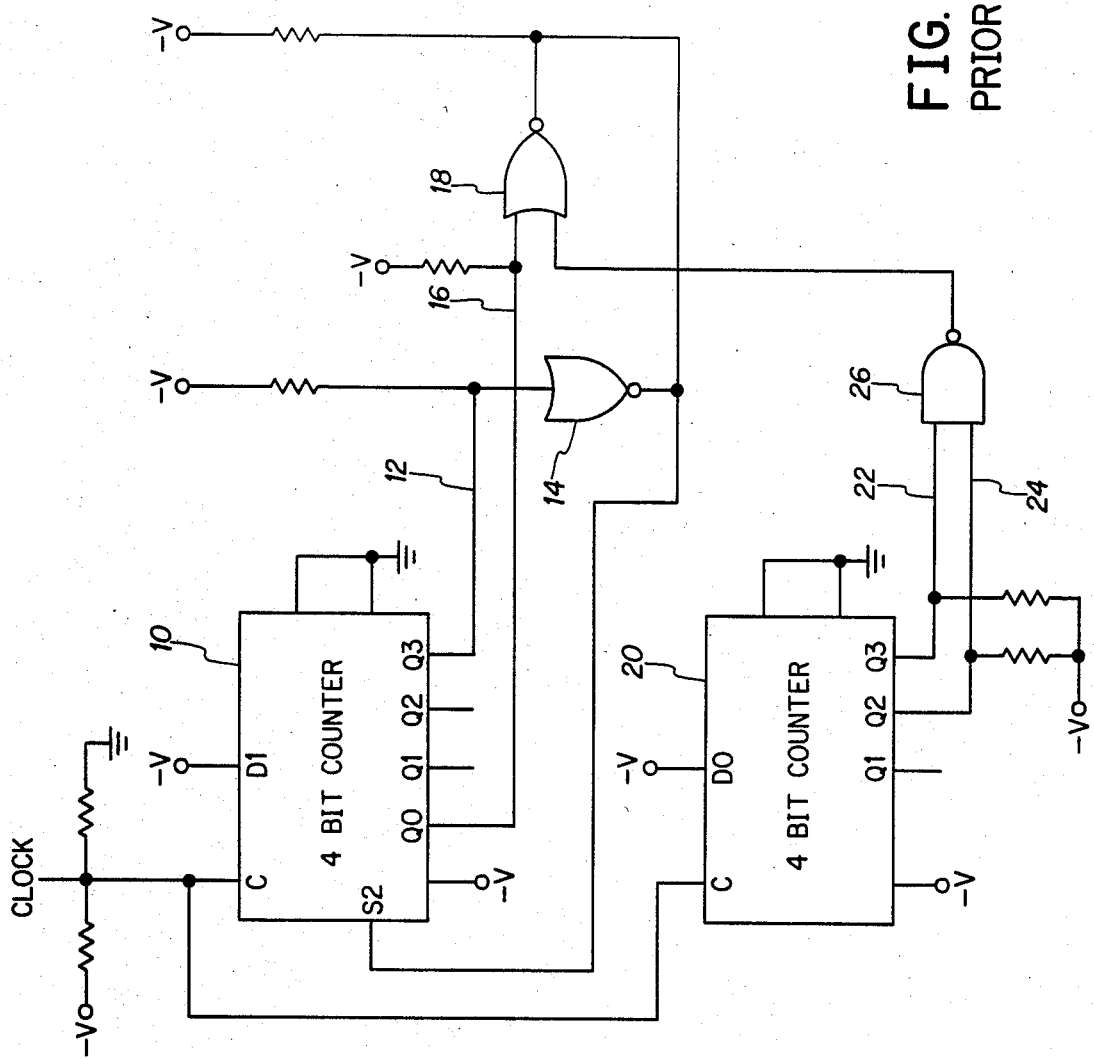
FIG. 1 is an illustration of a prior art implementation of the present inventive concept.

In FIG. 1 a counter, which in one embodiment was a four bit counter, is generally designated as 10 and has output leads indicating a count to terminals Q0, Q1, Q2 and Q3. A lead from the Q3 terminal is further designated as 12 and is supplied to an inverter 14 for returning a signal to the S2 input of counter 10. The Q0 output of counter 10 is provided on a lead labeled 16 and is supplied as an input to an NOR gate 18 having its output also connected to the S2 input of counter 10. A second counter 20 has only outputs Q1, Q2 and Q3 illustrated wherein the leads connected to outputs Q2 and Q3 are designated as 22 and 24, respectively, and supplied to a NAND gate 26 which has its inverted output connected as a second input to NOR gate 18. Each of the counters 10 and 20 have a clock input labeled C.

Figure 2:
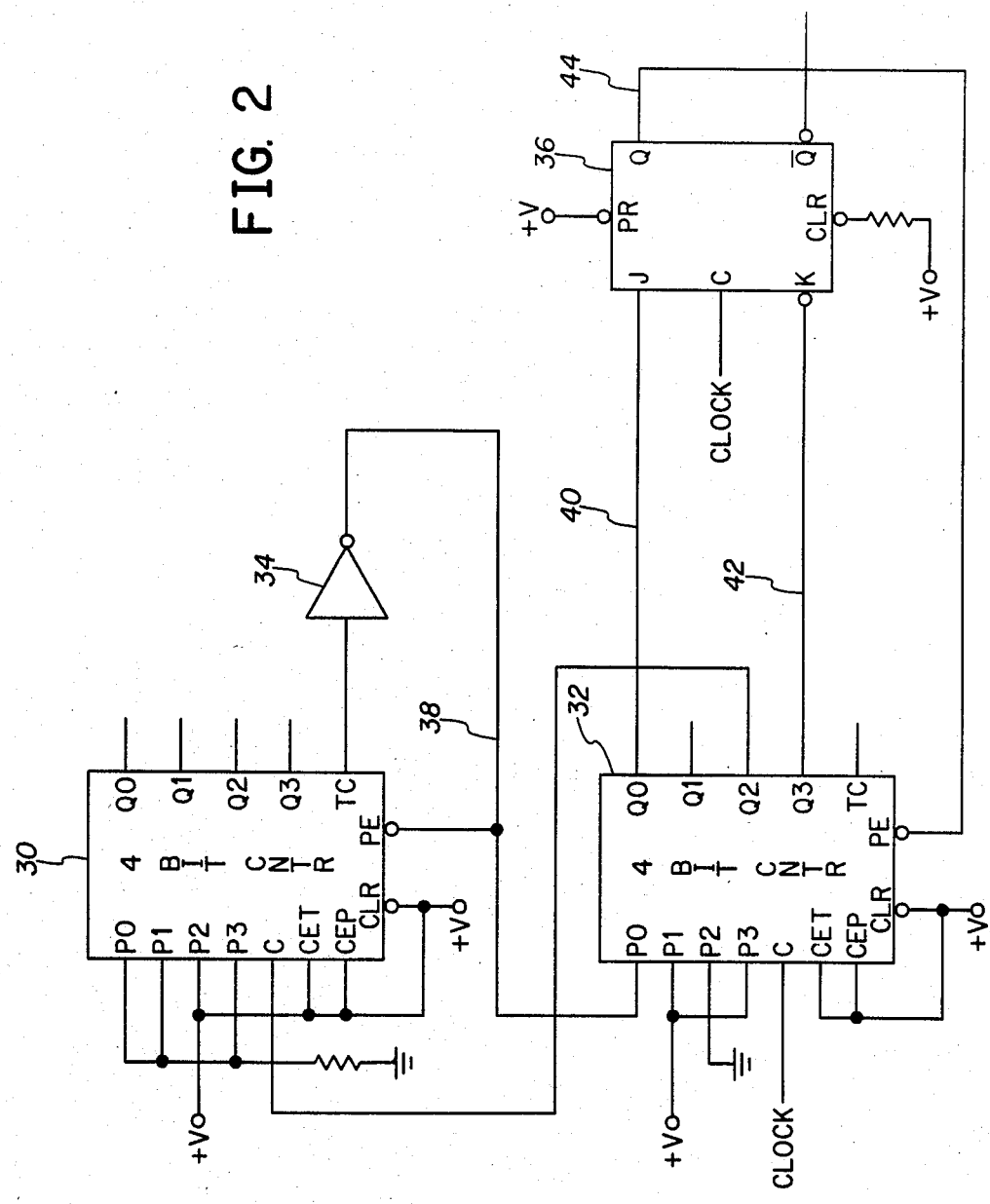
FIG. 2 is a block schematic diagram of the inventive concept as used in a variable modulo counter to replace the circuit of FIG. 1.

FIG. 2 has a first counter 30 and a second counter 32 along with an inverter 34 and a J-K flip-flop 36. The counter 30 has a plurality of initializing leads P0 through P3 which are connected either to logic 0 ground or a logic 1 positive terminal. The counter 32 has a similar set of leads. The inverter 34 provides an output on lead 38 to the parallel enable (PE) input of counter 30 as well as providing an input to the P0 input of counter 32. The Q0 output or most significant bit position of counter 32 is connected via a lead 40 to the J input of J-K flip-flop 36 while the least significant bit Q3 is connected via a lead 42 to an inverting input labeled K on J-K flip-flop 36. In effect, the K input is a $\overline{K}$ input. A Q output of J-K flip-flop 36 is connected via a lead 44 back to the parallel enable input of counter 32. The counter 32 also has a CET input connected to receive outside signals for reasons not pertinent to the present inventive concept. The terminal labeled TC on the two counters is a terminal that goes high when the highest count has been reached by the counter and it stays high for only one count before the count "rolls over" to a logic 0 count condition.

Figure 3:
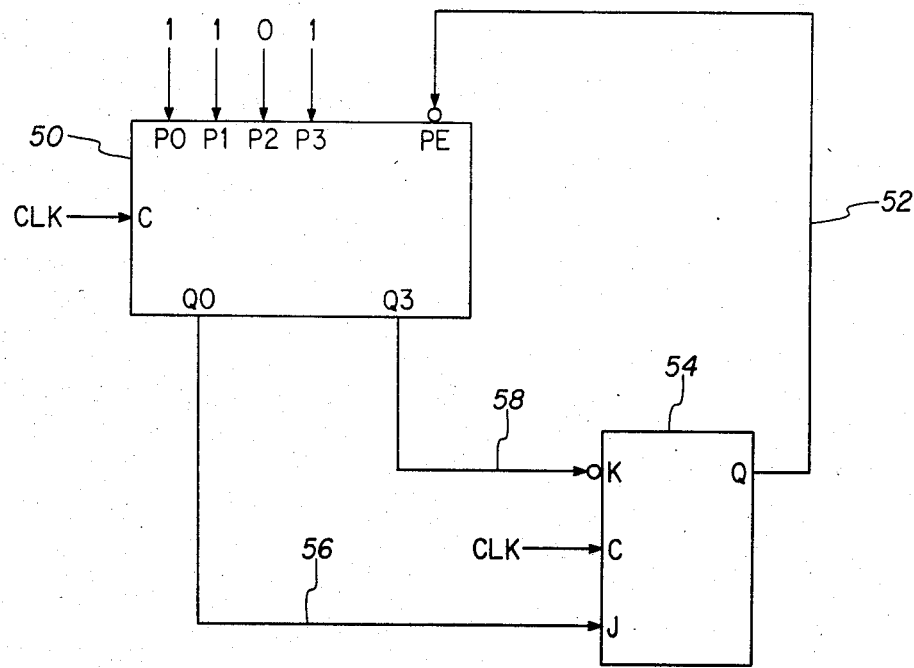
FIG. 3 is a basic presentation of the inventive concept.

In FIG. 3 a counter much on the order of those shown in FIG. 2 is illustrated as block 50 having inputs P0 through P3 and a parallel enable input connected to a lead 52. The parallel enable input receives output signals from the Q output of a J-K flip-flop 54 having its J input connected to a Q0 terminal of counter 50 by a lead 56 and its $\overline{K}$ input connected to a Q3 output of counter 50 by a lead 58.

Figure 4:
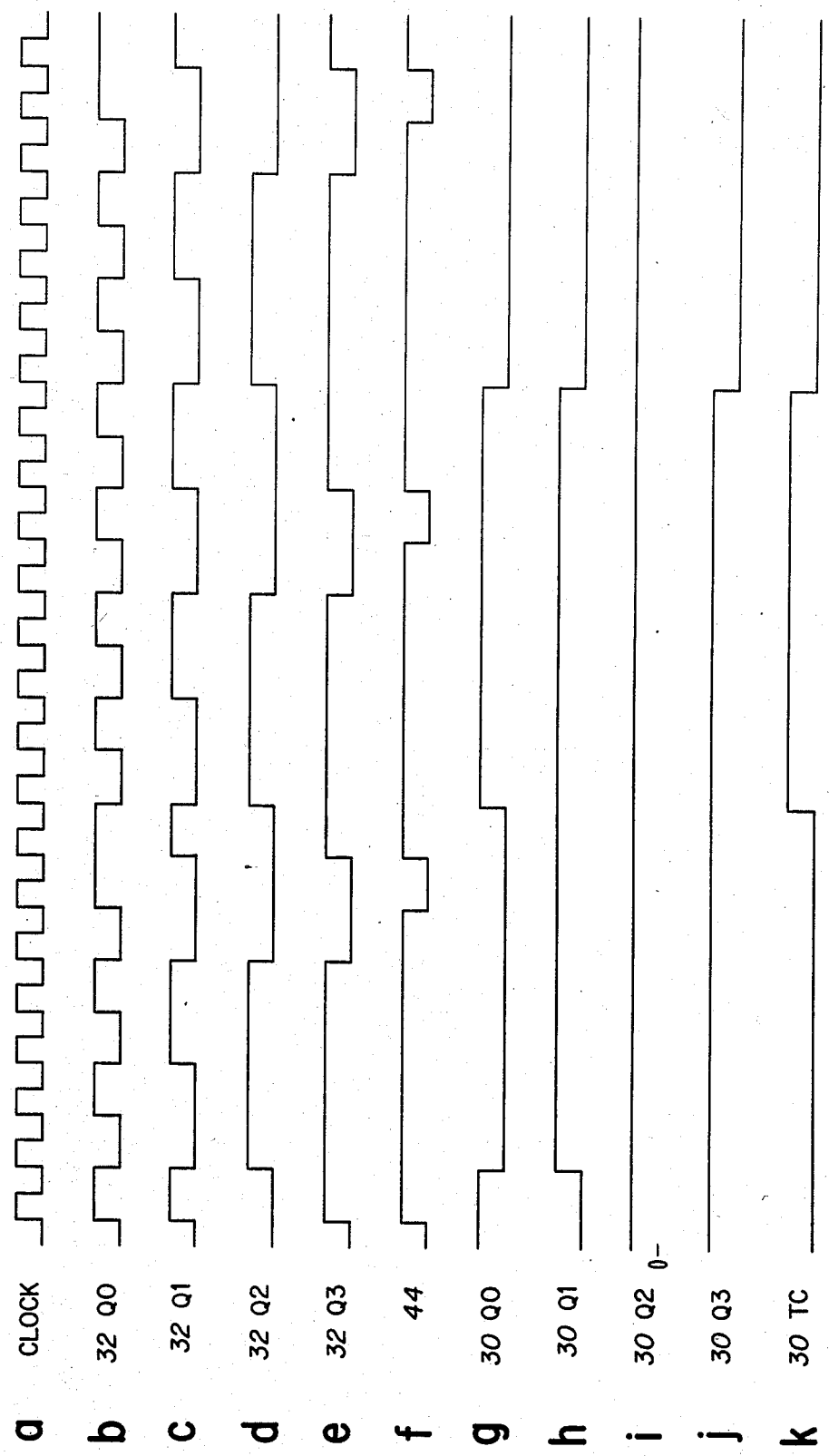
FIG. 4 is a set of waveforms which may be used in explaining the operation of FIG. 2.

In FIG. 4 waveform a represents the clock input applied to counter 32 while waveform b represents the Q0 output terminal of counter 32. The waveforms c through k represent the appropriate other terminals of counters 32 and 30 as well as the Q output lead 44 of J-K flip-flop 36.

FIG. 5 is a different representation of the Q0 through Q3 outputs of counter 32 which may provide an easier visualization of operation of counter 32 with different count outputs indicated for relative times a through h. In FIG. 5 there is also the logic value illustrated on the righthand column for the Q output on lead 44 of J-K flip-flop 36.

FIG. 6 is a representation similar to that of FIG. 5 except it is for the occasional times when counter 32 is set up to divide by 8 as opposed to dividing typically by 7.

In FIG. 7 the logic values, output at the time of the next clock transition, at the Q terminal 44 are provided for each of four sets of input conditions a through d on the J and $\overline{K}$ inputs.

OPERATION

The basic operation of the inventive concept can be ascertained from a discussion of FIG. 4 in conjunction with the truth table of FIG. 5.

The truth table of FIG. 5 provides the logic values output at each of the Q output terminals of counter 50 of FIG. 3. FIG. 3 only illustrates the Q0 and Q3 outputs since these are the only ones that are involved in the decision process. The counter is initialized to some number such as the 1011 indicated adjacent the inputs to P3 through P0 of counter 50. When a logic 0 is applied to the PE input of counter 50, the value on the P0 through P3 inputs is transferred to the Q outputs. When the logic 0 is removed from the PE input, the counter is incremented with each clock input so that the count at the Q output terminals changes. In observing the changing logic values of FIG. 5, the values of the Q0 and Q3 output terminals will be noted as both being logic 0 only at the time period of row f when the maximum count of counter 50 has been exceeded and the counter rolls over to a new beginning. At this point, according to the truth table of FIG. 7, the J-K flip-flop operates as a logic value detection device and changes its output to a logic 0. When the next clock is applied to counter 50, the Q0 output changes to a logic 1 thereby toggling the J-K flip-flop to change the output on lead 52 from a logic 0 to a logic 1. This change in logic level from 1 to 0 to the parallel enable input of counter 50, along with the next 0 to 1 transition on the clock input, loads the values in the P input register of counter 50 to the output Q register of counter 50 and the counter continues counting from there. In other words, the indicated values in row h of FIG. 5 are the same as, and in fact, are a repeat on a repetitive basis of the values in line a of FIG. 5. Thus, with the given loaded values on the P terminals of FIG. 3, the counter will continually count for six counts and then output a logic 0 on lead 52 so as to reload the input count from the P terminals and continue counting towards maximum available count. This produces a divide by 7 circuit. If the P0 terminal were changed to logic 0 the counter would have to count one more time before operating the J-K flip-flop and it would then be a count of or divide by 8. This logic value set of steps is illustrated in FIG. 6.

The circuits of FIGS. 1 and 2 are both designed to provide a modulo 85 clock divide circuit. This is accomplished by counting to seven for eleven times and counting to eight the twelfth time. In other words, eleven 7's and one 8 equals 85.

The counter 30 of FIG. 2 commences with a count of 0100 on the terminals P0 through P3, respectively. The counter then counts the output logic 0 to logic 1 transitions from the Q2 output of counter 32. As will be observed from the tables shown in FIGS. 5 and 6, this occurs only once each count cycle. Thus, in each count towards maximum of counter 32, counter 30 is incremented by one count. Therefore, on the twelfth count, the output from the TC output of counter 30 changes to a logic 1 indicating that the highest count by the counter has been attained. This output is then inverted by inverter 34 and applied to the parallel enable input and also to the P0 input of counter 32. This is illustrated in the timing diagram of FIG. 4. Normally, for eleven counts, the Q0 output of counter 32 is nonsymmetrical every seventh clock. However, it will be noted that at the end of the time when waveform k is a logic 1, the waveform b is symmetrical. This logic value transition is caused by the loading of an inverted logic 1 rather than the more typical logic 0 value used in the other eleven counts.

Although not pertinent to the discussion of this invention, FIG. 1 operates in a very similar manner in that counter 10 has a modulo 12 count while counter 20 normally has a modulo 7 count except when altered by the logic to count to eight once every twelfth count of the counter 10.

The circuit of FIG. 2 is merely a specific implementation of the inventive concept which involves using a J-K flip-flop as a decoding device to simplify the circuit and speed up the operation as compared to the circuitry involved in FIG. 1.

We therefore wish to be limited not by any specific embodiment shown or specific combination of outputs of a counter in connection with a J-K flip-flop but only by the scope of the appended claims wherein we claim.

We claim:

1. The method of dividing a clock signal comprising, the steps of:
   counting the clock signal cycles with a counter means and outputting a binary count indication on a plurality of signal leads;
   monitoring the logic value of two of the binary count indication signal leads by directly connecting the same with respective J-K inputs of a J-K flip-flop; and
   actuating the setting of the counter means to a given value with an output of the J-K flip-flop when a predetermined set of logic values are applied to said J-K inputs of said J-K flip-flop.

2. Apparatus for dividing a clock signal comprising, in combination:
   counter first means, including count value preset input means, clock signal input means and a plurality of signal leads providing a binary count value output means, for counting the clock signal cycles input to said clock signal input means thereof; and
   J-K flip-flop second means, directly electrically connected to two of said plurality of signal leads comprising said output means of said first means and to said preset means of said first means, for monitoring the logic value thereof with the J-K inputs of said J-K flip-flop and presetting said first means with an output of said second means when a predetermined set of logic values are detected at said J-K inputs of said J-K flip-flop second means.

3. Apparatus for dividing the frequency of occurrence of a clock signal comprising, in combination:
   counter first means, including count value preset input means, clock signal input means and a plurality of signal leads providing a binary count value output means, for counting the clock signal cycles input to said clock signal input means thereof;
   counter second means, connected to said first means whereby signals may be exchanged between said first and said second means, for counting a specific condition of said first means and periodically altering the preset count value of said first means to achieve a clock division average by said first means which is other than an integer value; and
   J-K flip-flop third means, connected to two of said plurality of signal leads comprising said output means of said first means and to said preset means of said first means, for monitoring the logic value thereof with the J-K inputs of a J-K flip-flop and presetting said first means with an output of said third means when a predetermined set of logic values are detected at said J-K inputs of said J-K flip-flop third means.

* * * * *